United States Patent [19]

Ahn

[11] Patent Number: 5,886,944
[45] Date of Patent: Mar. 23, 1999

[54] MEMORY DEVICE HAVING PAGE COPY MODE

[75] Inventor: Jin-Hong Ahn, Kyungki-Do, Rep. of Korea

[73] Assignee: LG Semicon Co., Ltd., Cheongju, Rep. of Korea

[21] Appl. No.: 997,739

[22] Filed: Dec. 24, 1997

[30] Foreign Application Priority Data

Dec. 30, 1996 [KR] Rep. of Korea ............... 77506/1996

[51] Int. Cl.$^6$ ............................................ G11C 8/00
[52] U.S. Cl. ................................... 365/230.06; 365/238.5
[58] Field of Search ........................ 365/230.06, 238.5, 365/230.02, 230.03, 230.01; 395/309

[56] References Cited

U.S. PATENT DOCUMENTS

| | | | |
|---|---|---|---|
| 5,210,723 | 5/1993 | Bates et al. | 365/238.5 |
| 5,233,565 | 8/1993 | Wang | 365/230.06 |
| 5,619,473 | 4/1997 | Hotta | 365/238 |
| 5,621,692 | 4/1997 | Lin | 365/238.5 |
| 5,761,657 | 5/1998 | Hotta | 365/230.06 |

*Primary Examiner*—Tan T. Nguyen
*Attorney, Agent, or Firm*—Fleshner & Kim

[57] ABSTRACT

A memory device has a page copy mode that writes data into memory cell by memory page units by using a common bit line without outputting accessed data externally. The memory device, e.g., a DRAM includes an interface unit having an address multiplexor for multiplexing a plurality of address signal bits in accordance with a row address strobe signal. A row address resetting unit is for resetting an output signal from the address multiplexor in accordance with the row address strobe signal. A pre-decoder decodes an output signal from the row address resetting unit. A row decoder is for decoding an output signal from the pre-decoder. A word line driving unit receives an output signal from the row decoder to drive a corresponding word line. A block decoding signal latch unit latches an output signal from the pre-decoder in accordance with a page copy signal. A block decoder decodes an output signal from the block decoding signal latch unit and a sense amplifier controller receives an output signal from the block decoder. The sense amplifier controller outputs a sense amplifier enabling signal and a sense amplifier equalizing signal to a sense amplifier driving unit.

17 Claims, 5 Drawing Sheets

FIG.3
BACKGROUND ART
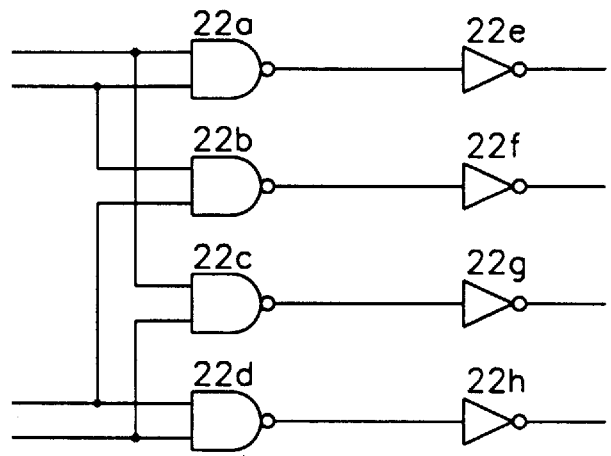
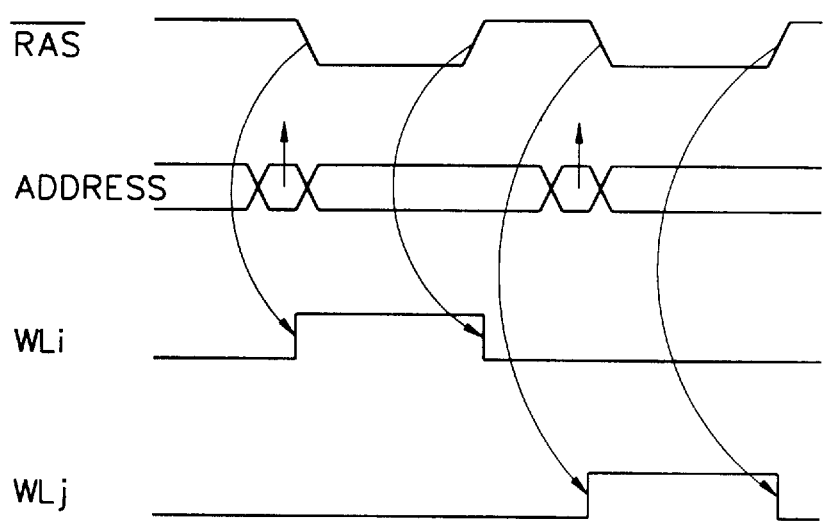
FIG.4A
BACKGROUND ART  $\overline{RAS}$
FIG.4B
BACKGROUND ART  ADDRESS
FIG.4C
BACKGROUND ART  WLi
FIG.4D
BACKGROUND ART  WLj
FIG.4E
BACKGROUND ART  BIT LINE

FIG.6A $\overline{RAS}$
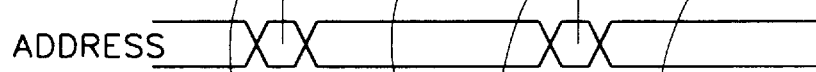
FIG.6B ADDRESS
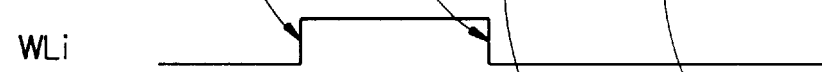
FIG.6C WLi
FIG.6D WLj
FIG.6E PAGE-CP
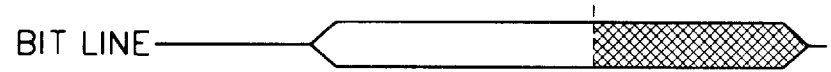
FIG.6F BIT LINE
FIG.7A $\overline{RAS}$
FIG.7B $\overline{CAS}$
FIG.7C $\overline{WE}$
FIG.7D PAGE-CP

MEMORY DEVICE HAVING PAGE COPY MODE

BACKGROUND OF THE INVENTION

1. Field of the Invention

The present invention relates to a memory device, and in particular, to a semiconductor memory device.

2. Background of the Related Art

FIG. 1 illustrates a memory cell array and a sense amplifier in a related art memory device, e.g., DRAM. The memory cell array and sense amplifier of the related art DRAM includes a sense amplifier driving unit 10 for receiving sense amplifier enabling signals SN and SPB and a sense amplifier equalizing signal SAEQ and sense amplifiers 11–14. The sense amplifiers 11–14 are driven by the sense amplifier driving unit 10 and connected with respective pairs of bit lines BL0–BLm and BL0b–BLmb. The memory cell array and sense amplifier further includes pre-charge units 15–18 for pre-charging the bit lines BL0–BLm to a level corresponding to one-half of the supply voltage Vcc in accordance with a bit line equalizing signal BLEQ and a pre-charge signal line VLBP and a memory cell array 19 having a plurality of cells 19a and 19b connected with word lines WL0–WLn and the bit lines BL0–BLm and BL0b–BLmb. The memory cell array 19 is configured in a folded form. In other words, the cells 19a and 19b are formed on either the bit lines BL0-BLm and BL0b–BLmb.

The sense amplifier driving unit 10 includes a PMOS transistor 10a. The gate of the PMOS transistor 10a receives the sense amplifier enabling signal SPB, the source receives the supply voltage Vcc and the drain is connected with a signal line SPC to the sense amplifiers 11 through 14. An NMOS transistor 10b has the drain connected with the drain of PMOS transistor 10a and the signal line SPC. The gate of the NMOS transistor 10b receives the sense amplifier equalizing signal SAEQ, and the source is connected with a signal line SNCB to the sense amplifiers 11 through 14. An NMOS transistor 10c has the drain connected with the source of the NMOS transistor 10b and the signal line SNCB, the gate receives the sense amplifier enabling signal SN, and the source is connected to ground supply voltage Vss.

The sense amplifier 11 includes PMOS transistors 11a and 11b. The sources of the PMOS transistors 11a and 11b are commonly connected with the signal line SPC and the respective gates are connected with the bit lines BL0b and BL0, and with the drain of their counterpart PMOS transistor. The sources of NMOS transistors 11c and 11d are commonly connected with the signal line SNCB. The drains of the NMOS transistors 11c and 11d are connected to the drains of the PMOS transistors 11a, 11b, respectively, and the respective gates are connected the drain of their counterpart NMOS transistor and with the bit lines BL0b and BL0, respectively. The remaining sense amplifiers 12 through 14 have the same construction as the sense amplifier 11.

The pre-charge unit 15 includes an NMOS transistor 15a, the drain and source of which are respectively connected with the bit lines BL0 and BL0b, and the gate of which is connected with a bit line equalizing signal BLEQ line and gates of NMOS transistors 15b and 15c. The sources of the NMOS transistors 15b and 15c are commonly connected to the pre-charge signal VLBP line, the gates are connected with the bit line equalizing signal BLEQ line and the respective drains are connected to the bit lines BL0 and BL0b, respectively. The remaining pre-charge units 16 through 18 have the same construction as the pre-charge unit 15.

As shown in FIG. 2, the interface unit for driving the memory cell array and sense amplifiers of the related art DRAM includes an address multiplexor 20 for multiplexing address signal bits Ai and Aj in accordance with a row address strobe signal /RAS and a row address resetting unit 21. The interface unit further includes for resetting the output signal from the address multiplexor 20 in accordance with the row address strobe signal /RAS and a pre-decoder 22 for decoding the output signal from the row address resetting unit 21. The interface unit further includes a row decoder 23 for decoding the output signal from the pre-decoder 22, a word line driving unit 24 for receiving the output signal from the row decoder 23 and for driving the word lines WL0 through WLn, a block decoder 25 for decoding the output signal from the pre-decoder 22, and a sense amplifier controller 26 for receiving the output signal from the block decoder 25. The sense amplifier controller 26 also applies the sense amplifier enabling signals SN and SPB and the sense amplifier equalizing signal SAEQ to the sense amplifier driving unit 10 as shown in FIG. 1.

The address multiplexor 20 includes an inverter 20a for inverting the row address strobe signal /RAS, a transmission gate 20b for switching the address signal bit Ai line in accordance with the row address strobe signal /RAS and the inverted signal RAS from the inverter 20a and inverters 20c and 20d for latching the output signal from the transmission gate 20b. The address multiplexor 20 further includes a transmission gate 20e for switching the address signal bit line Aj in accordance with the row address strobe signal /RAS, and inverters 20f and 20g for latching the output signal from the transmission gate 22e. The remaining address signal bit lines have the same associated circuitry as the bit line Aj.

The row address resetting unit 21 includes NOR-gates 21a through 21d for each NORing the row address strobe signal /RAS and the output signals of inverters 20c and 20d from the address multiplexor 20. Each pre-decoder 22, as shown in FIG. 3, includes NAND-gates 22a through 22d for selecting 1 valid output signal "Low" from the row address resetting unit 21, and inverters 22e through 22h for inverting the respective output signals of the NAND-gates 22a through 22d.

For example, while /RAS is "Low" if the output signal of the NOR gate 21a is "High" and the output signal of the NOR gate 21c is "Low", the output signal of the NOR gate 21b becomes "Low" and the output signal of the transmission gante 20b becomes "High".

So only the output signal of the pre-decoder 22c becomes "Low" and the other 3 signals become "High".

In case /RAS is "High", NOR gates 21a,b,c,d become "High" and pre-decoders 22e,f,g,h become "Low".

The operation of the related art DRAM will now be described. When the row address strobe signal /RAS, as shown in FIG. 4A, is transited (asserted), the address signal, as shown in FIG. 4B, is inputted into the address multiplexor 20. The row address passed through the address multiplexor 20 is applied to the pre-decoder 22 through the row address resetting unit 21, and if the row address strobe signal /RAS is high level, the row address signal is reset by the row address resetting unit 21.

The pre-decoder 22 decodes the row address inputted and outputs the row address to the row decoder 23 and the block decoder 25, respectively. Therefore, in the word line driving unit 24, a high level signal is carried on the word line WLi corresponding to the row address, and the bit line corresponding to the address signal is selected.

The sense amplifier controller 26 outputs sense amplifier enabling signals SN and SPB and sense amplifier equalizing signal SAEQ to activate the sense amplifier driving unit 10 so that the data of a corresponding cell of the memory array 19 is read. Thereafter, the row address strobe signal /RAS is again transited to a low level, and the signal of the word line WLi is transited to a low level. In addition, the bit lines BL0 through BLm and BL0b through BLmb are pre-charged as much as one-half of the voltage Vcc in accordance with the pre-charge signal VBLP.

When the row address strobe signal /RAS is again transited (asserted) another address signal is inputted. Therefore, the word line WLj corresponding to the new address signal is activated. In the related art DRAM, whenever the address is changed, the bit lines BL0 through BLm and BL0b through BLmb are always pre-charged so that the data of the next addressed memory location is not combined with the previous data.

However, the related art DRAM has various disadvantages. Since the bit lines BL0 through BLm and BL0b through BLmb are always pre-charged when the address is changed, it is not possible to write the data corresponding to the previous address and stored in the sense amplifier into the memory cell of another address via the common bit line.

SUMMARY OF THE INVENTION

An object of the present invention to overcome at least the above-described disadvantages in the related art.

Another object of the present invention to provide memory device that performs the page copy operation.

Another object of the present invention is to provide a memory device that eliminates a bit line pre-charging process to perform a page copy mode.

A further object of the present invention to provide a memory device that performs a page copy operation that writes data by memory page units into a memory using a common bit line without outputting accessed data outside of the memory device chip.

To achieve at least the above objects in whole or in parts, there is provided a memory device that includes an address multiplexor for multiplexing a plurality of address signal bits in accordance with a first signal, a row address resetting unit for resetting an output signal from the address multiplexor in accordance with the first signal, a pre-decoder for decoding an output signal from the row address resetting unit, a row decoder for decoding an output signal from the pre-decoder, a word line driving unit for receiving an output signal from the row decoder to drive a word line, a block decoding signal latch unit for latching an output signal from the pre-decoder in accordance with a second signal, a block decoder for decoding an output signal from the block decoding signal latch unit, and a sense amplifier controller for receiving an output signal from the block decoder to output a sense amplifier enabling signal and a sense amplifier equalizing signal to a sense amplifier driving unit.

To further achieve the above objects in whole or in parts, there is provided an interface unit for use with a memory device according to the present invention that includes a decoder unit that processes an input address signal based on a first signal to generate an output signal; a row driving unit that decodes the output signal from the decoder unit to drive a word line; a page copy mode unit that latches the output signal from the decoder unit based on the second signal; a block driving unit that receives an output signal from the page copy mode unit and outputs a sense amplifier enabling signal and a sense amplifier equalizing signal, wherein the page copy mode unit switches the interface unit between at least one of a page copy mode and a normal mode based on the second signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 3 is a circuit diagram illustrating a pre-decoder of the interface unit shown in FIG. 2;

FIG. 4A is a diagram illustrating a waveform of a row address strobe signal;

FIG. 4B is a diagram illustrating waveform of an address signal;

FIGS. 4C and 4D are diagrams illustrating waveforms of signals applied to word lines;

FIG. 4E is a diagram illustrating waveform of a data signal carried on a bit line;

FIG. 6A is a diagram illustrating waveform of a row address strobe signal;

FIG. 6B is a diagram illustrating waveform of an address signal;

FIGS. 6C and 6D are diagrams illustrating waveforms of signals applied to word lines;

FIG. 6E is a diagram illustrating waveform of a page copy signal;

FIG. 6F is a diagram illustrating waveform of a data signal carried on a bit line;

FIG. 7A is a diagram illustrating waveform of a row address strobe signal;

FIG. 7B is a diagram illustrating waveform of a column address strobe signal;

FIG. 7C is a diagram illustrating waveform of a write enable signal; and

FIG. 7D is a diagram illustrating waveform of a page copy signal.

DETAILED DESCRIPTION OF PREFERRED EMBODIMENTS

Figure 5:
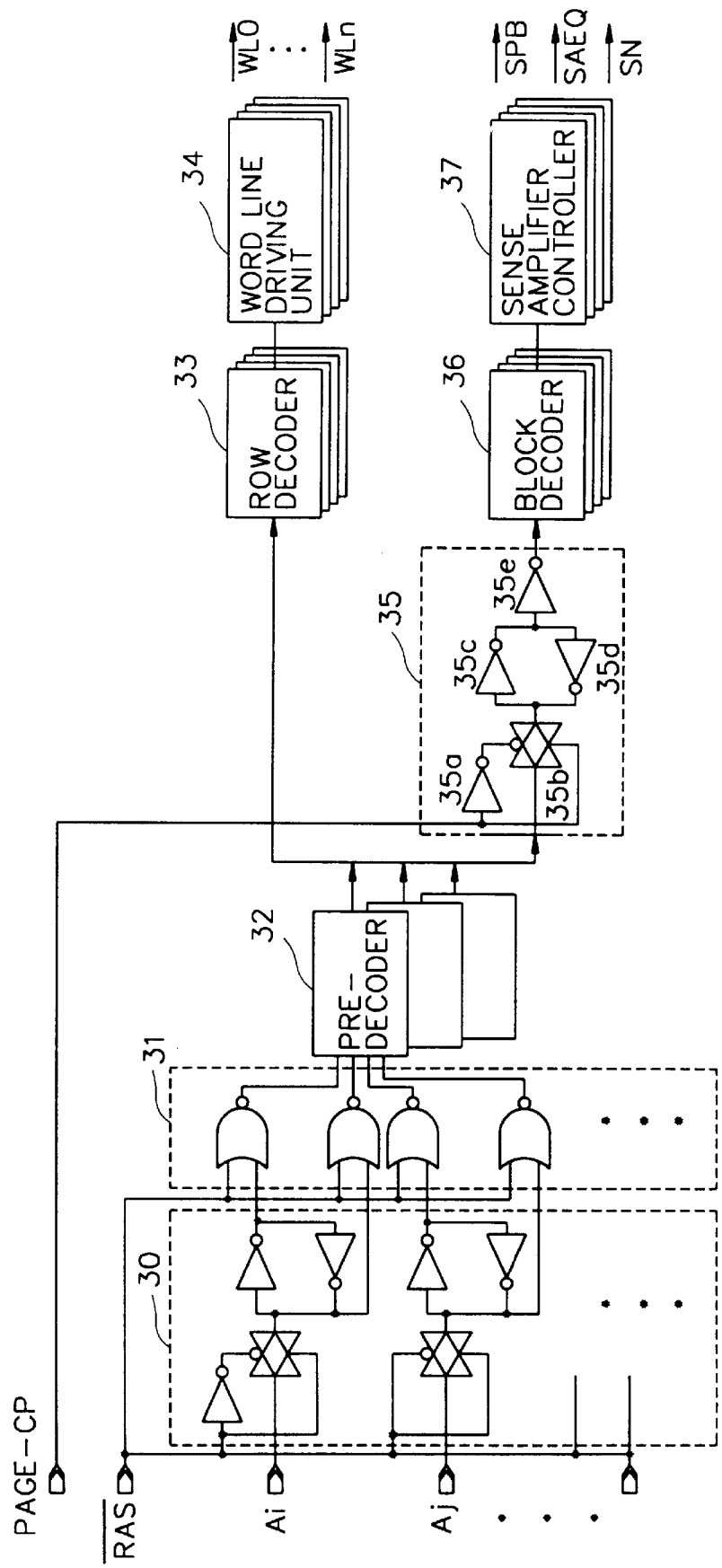
FIG. 5 is a schematic block diagram illustrating a preferred embodiment of a memory device interface unit according to the present invention.

As shown in FIG. 5, an interface unit for a preferred embodiment of a memory device, e.g., Dynamic Random Access Memory (DRAM), having a page copy mode according to the present invention includes an address multiplexor 30 for multiplexing address signal bits Ai and Aj in accordance with a row address strobe signal /RAS. A row address resetting unit 31 resets the output signal from the address multiplexor 30 in accordance with the row address strobe signal /RAS. A pre-decoder 32 decodes the output signal from the row address resetting unit 31.

The interface unit further includes a row decoder 33 that decodes the output signal from the pre-decoder 32 and a word line driving unit 34 that receives the output signal from the row decoder 33 to drive word lines WL0 through WLn. A block decoding signal latch unit 35 latches the output signal from the pre-decoder 32 in accordance with a page copy signal PAGE-CP. A block decoder 36 decodes the output signal from the block decoding signal latch unit 35 and a sense amplifier controller 37 receives the output signal from the block decoder 36. The sense amplifier controller 37 also outputs sense amplifier enabling signals SN and SPB and a sense amplifier equalizing signal SAEQ.

Figure 1:
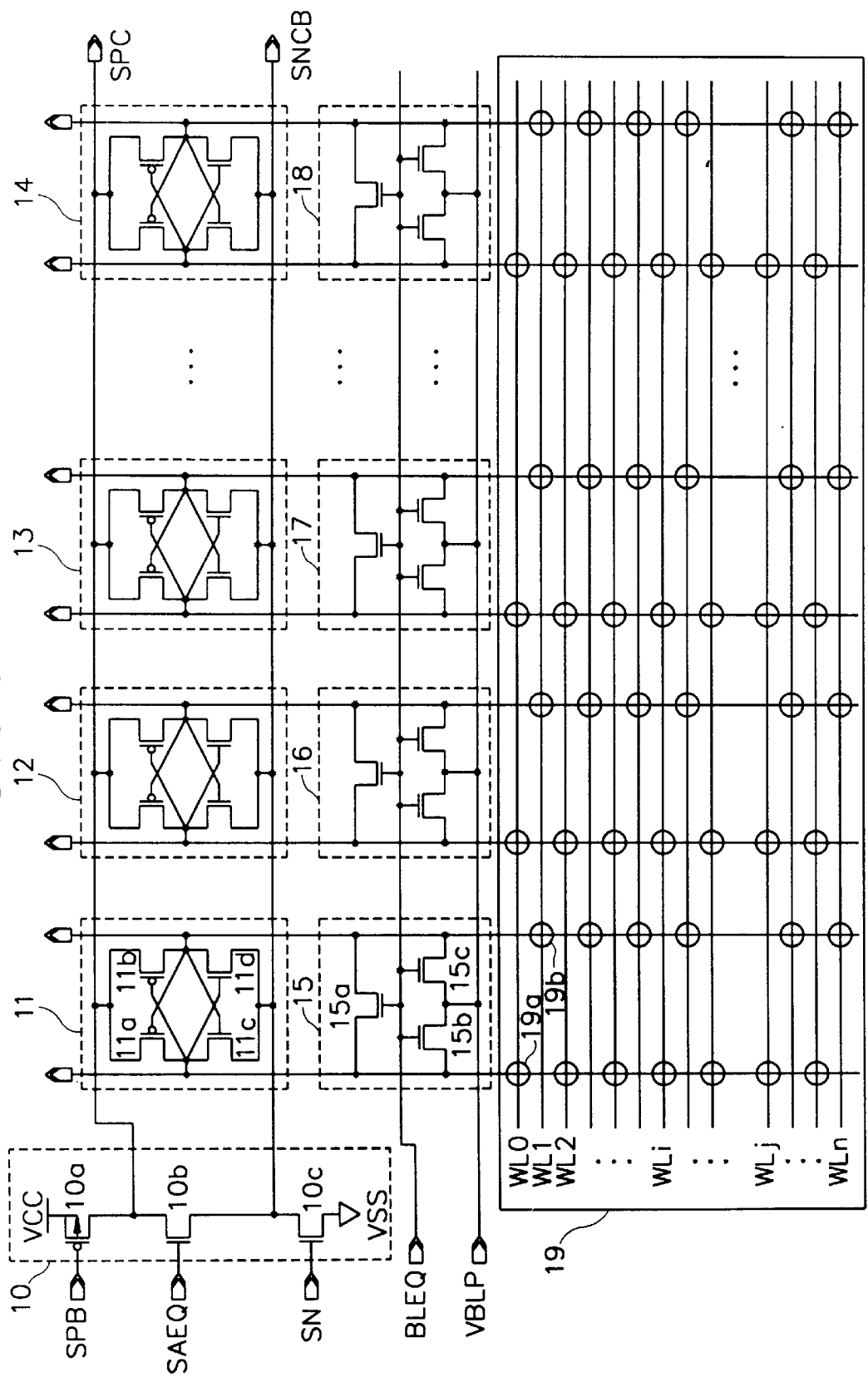
FIG. 1 is a schematic diagram illustrating a memory array and a sense amplifier for a related art DRAM.
Figure 2:
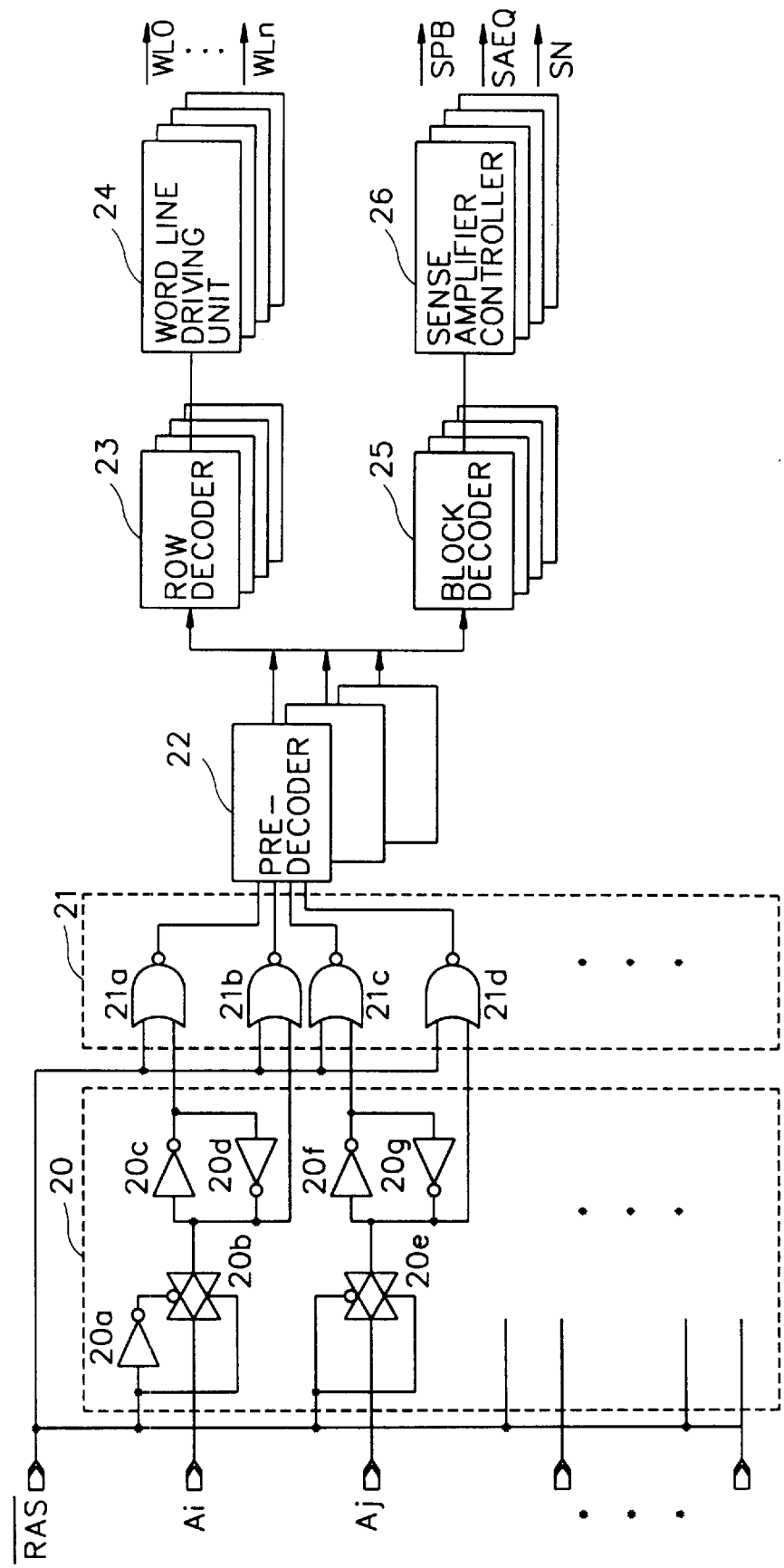
FIG. 2 is a schematic block diagram illustrating an interface unit of the DRAM shown in FIG. 1.

Construction and operations of the address multiplexor 30, the row address resetting unit 31, the pre-decoder 32, the row decoder 33, the word line driving unit 34, the block decoder 36 and the sense amplifier controller 37 are similar to the corresponding element blocks in the related art shown in FIGS. 1 and 2. Thus, a detailed description is omitted.

The block decoding signal latch unit 35 includes an inverter 35a for inverting the page copy signal PAGE-CP and a transmission gate 35b for switching the output signal from the pre-decoder 32 in accordance with the output signal from the inverter 35a and the page copy signal PAGE-CP. The block decoding signal latch unit 35 further includes inverters 35c and 35d coupled in reverse parallel for latching the output signal from the transmission gate 35b and an inverter 35e for inverting the output signal from the latch formed by the inverters 35c, 35d. The transmission gate 35b receives the output signal from the inverter 35a via the gate of an NMOS pass transistor, and the page copy signal PAGE-CP via the gate of a PMOS pass transistor.

Operations of the DRAM having the preferred embodiment of the interface unit providing a page copy mode will now be described. When the row address strobe signal /RAS as shown in FIG. 6A is transited to a low level, the word line WLi as shown in FIG. 6C is activated high in accordance with the address signal as shown in FIG. 6B. In addition, the output signal from the pre-decoder 32 is latched by the block decoding signal latch unit 35 in accordance with the page copy signal PAGE-CP. The sense amplifier controller 37 outputs a low level sense amplifier enabling signal SPB, a high level sense amplifier enabling signal SN and a low level sense amplifier equalizing signal SAEQ, respectively, to activate a corresponding sense amplifier. Therefore, the corresponding sense amplifier senses the data carried on the bit line.

Thereafter, if the row address strobe signal /RAS is transited to high level, the row address resetting unit 31 resets the row address. Therefore, the output signal from the pre-decoder 32 is reset, and as a result, the signal on the word line WLi is transited from high level to a low level. The page copy signal PAGE-CP is transited to a high level before the row address strobe signal /RAS is transited from the low level to a high level. The transmission gate 35b of the block decoding signal latch unit 35 is turned off before the output signal from the pre-decoder 32 is reset. Thus, the output signal from the pre-decoder 32, which was inputted to the block decoding latch unit 35 before the output signal from the pre-decoder 32 is reset, is latched. As a result as shown in FIG. 6F, the data signal of the bit line is not transited to a low level. In other words, the bit line is not pre-charged, and the previously sensed data signal continues to be carried.

If the row address strobe signal /RAS is transited from the high level to a low level, a new address signal is inputted, and the word line WLj corresponding to the new address becomes activated high as shown in FIG. 6D. Since the page copy signal PAGE-CP maintains a high level, the transmission gate 35b of the block decoding signal latch unit 35 maintains a turned-off state. Thus, the sensed data carried on the bit line is written into the memory cell connected to the word line WLj via the common bit line while the word line WLj is being activated. In other words, the page of the word line WLi is copied to the memory cell coupled to the word line WLj.

The page copy signal PAGE-CP maintains a high level (e.g., WLj) during the period of the row address strobe signal /RAS. If the newly selected word line (e.g., via Wli) is coupled to the identical memory block, the data of the initially sensed cell can be copied to each word line selected. For example, the operation of writing the data onto word lines can be used when testing the DRAM.

If the page copy signal PAGE-CP is transited to a low level while the row address strobe signal /RAS maintains a high level, the transmission gate 35b of the block decoding signal latch unit 35 is enabled. The enabled transmission on gate 35b passes the resetting signal of the row address to normally pre-charge the bit lines.

The page copy signal PAGE-CP can be input from a bonding pad of the DRAM chip. Alternatively, the page copy signal PAGE-CP can be input from a WCBR ((WEB, CAS Before RASB)(Write Enable, Column Address Strobe Before Row Address Strobe)) mode of a memory management unit.

As shown in FIGS. 7A through 7D, the page copy signal PAGE-CP is set when the address strobe signal /RAS as shown in FIG. 7A transits from high level to low level when the column address strobe signal /CAS as shown in FIG. 7B and the write enable signal /WE as shown in FIG. 7C are low level, respectively. In addition, the page copy signal PAGE-CP can be reset in the WCBR mode.

As described above, a DRAM having the preferred embodiment of the interface unit providing a page copy mode has various advantages. The data of all cells activated by a corresponding word line can be written by using a page copy signal PAGE-CP via a common bit line. Thus, the DRAM can be easily tested. In addition, since data can be written into a memory without outputting the data to the outside of the DRAM chip, the DRAM can be more quickly tested, which reduces electric power consumption.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A memory device comprising:

an address multiplexor that multiplexes a plurality of address signal bits based on a first signal;

a row address resetting unit that resets an output signal from the address multiplexor based on the first signal;

a pre-decoder that decodes an output signal from the row address resetting unit;

a row decoder that decodes an output signal from the pre-decoder;

a word line driving unit that receives an output signal from the row decoder to drive a word line;

a block decoding signal latch unit that latches an output signal from the pre-decoder based on a second signal;

a block decoder that decodes an output signal from the block decoding signal latch unit; and a sense amplifier controller that receives an output signal from the block decoder and outputs a sense amplifier enabling signal and a sense amplifier equalizing signal.

2. The memory device of claim 1, wherein the first signal is a row address strobe signal and the second signal is a page copy signal.

3. The memory device of claim 1, further comprising:

a sense amplifier that receives the sense amplifier enabling signal and the sense amplifier equalizing signal; and a memory cell array that receives the output signal from the word line driving unit.

4. The memory device of claim 3, wherein the sense amplifier includes a sense amplifier driving unit and the memory cell array has a folded structure.

5. The memory device of claim 1, wherein said block decoding signal latch unit comprises:

a first inverter that inverts the second signal;

a transmission gate that switches an output signal from the pre-decoder based on an output signal from the first inverter and the second signal;

a latch unit that latches an output signal of the transmission gate; and a second inverter that inverts an output signal from the latch unit.

6. The memory device of claim 5, wherein the block decoder receives an output signal from the second inverter.

7. The memory device of claim 5, wherein said transmission gate comprises:

a first transistor with a control electrode that receives the output signal from the first inverter; and a second transistor with a control electrode that receives the second signal.

8. The memory device of claim 7, wherein the first transistor is a NMOS pass transistor, the second transistor is a PMOS pass transistor and the control electrode is a gate.

9. The memory device of claim 5, wherein the latch unit comprises:

a third inverter that inverts the output signal from the transmission gate; and a fourth inverter that inverts an output signal from the third inverter, wherein an output signal of the fourth inverter is input to the third inverter.

10. The memory device of claim 1, wherein said page copy signal is received from at least one of a bonding pad of a DRAM chip and a WCBR mode ((WEB, CAS Before RASB) Write Enable, Column Address Strobe Before Row Address Strobe mode).

11. An interface unit for a memory device comprising:

a decoder unit that processes an input address signal based on a first signal to generate an output signal;

a row driving unit that decodes the output signal from the decoder unit to drive a word line;

a page mode unit that latches the output signal from the decoder unit based on a second signal;

a block driving unit that receives an output signal from the page mode unit and outputs a sense amplifier enabling signal and a sense amplifier equalizing signal, wherein the page mode unit switches the interface unit between at least one of a page copy mode and a second mode based on the second signal.

12. The interface unit of claim 11, wherein the page copy mode uses a common bit line.

13. The interface unit of claim 11, wherein the first signal is a row address strobe signal and the second signal is a page copy signal.

14. The interface unit of claim 11, wherein the decoder unit comprises:

an address multiplexor that multiplexes a plurality of address signal bits based on the first signal;

a row address resetting unit that resets an output signal from the address multiplexor based on the first signal; and a pre-decoder that decodes an output signal from the row address resetting unit to generate the decoder unit output signal.

15. The interface unit of claim 14, wherein the row driving unit comprises:

a row decoder that decodes an output signal from the pre-decoder; and a word line driving unit that receives an output signal from the row decoder to drive the word line.

16. The interface unit of claim 15, wherein the block driving unit comprises:

a block decoder that decodes the output signal from the page mode unit; and a sense amplifier controller that receives an output signal from the block decoder and that outputs the sense amplifier enabling signal and the sense amplifier equalizing signal to a sense amplifier unit of the DRAM.

17. The interface unit of claim 11, wherein the first signal is at least one of a signal received from a bonding pad of a DRAM chip and a signal generated in a WCBR mode.

* * * * *